United States Patent
Wu

(10) Patent No.: US 11,209,491 B2
(45) Date of Patent: Dec. 28, 2021

(54) ESTIMATION METHOD FOR STATE OF CHARGE OF BATTERY

(71) Applicant: STL Technology Co., Ltd., Kaohsiung (TW)

(72) Inventor: Chong-Yong Wu, Kaohsiung (TW)

(73) Assignee: STL TECHNOLOGY CO., LTD., Kaohsiung (TW)

( * ) Notice: Subject to any disclaimer, the term of this patent is extended or adjusted under 35 U.S.C. 154(b) by 135 days.

(21) Appl. No.: 16/689,124

(22) Filed: Nov. 20, 2019

(65) Prior Publication Data

US 2020/0182941 A1    Jun. 11, 2020

(30) Foreign Application Priority Data

Dec. 6, 2018  (CN) .......................... 201811489708.2

(51) Int. Cl.
*G01R 31/3842*  (2019.01)
*G01R 31/367*  (2019.01)
(Continued)

(52) U.S. Cl.
CPC ....... *G01R 31/3842* (2019.01); *G01R 31/367* (2019.01); *G01R 31/382* (2019.01); *G01R 19/16542* (2013.01); *G01R 31/3648* (2013.01)

(58) Field of Classification Search
CPC .............. G01R 31/3842; G01R 31/367; G01R 31/3648; G01R 31/382; G01R 19/16542
See application file for complete search history.

(56) References Cited

U.S. PATENT DOCUMENTS

| 6,369,547 | B2 * | 4/2002 | Suzuki | .................. H02J 7/0047 320/132 |
| 9,037,426 | B2 * | 5/2015 | Schaefer | ................... H02J 7/04 702/63 |

(Continued)

FOREIGN PATENT DOCUMENTS

| KR | 20170138488 A | * | 12/2017 | ........... G01R 31/392 |
| WO | WO-2012066920 A1 | * | 5/2012 | .............. B60L 58/12 |

OTHER PUBLICATIONS

C. Hua et al. ("Design and Implementation of a Residual Capacity Estimator for Lead-Acid Batteries," 2007 2nd IEEE Conference on Industrial Electronics and Applications, 2007, pp. 2018-2023, doi: 10.1109/ICIEA.2007.4318764) (Year: 2007).*

(Continued)

*Primary Examiner* — Daniel R Miller
*Assistant Examiner* — Christian T Bryant
(74) *Attorney, Agent, or Firm* — Chun-Ming Shih; HDLS IPR Services

(57) ABSTRACT

The invention provides an estimation method for state of charge (SOC) of battery. A reference SOC is inquired from a look-up table based on a voltage of battery detected. A voltage threshold is subtracted from the voltage of battery to obtain a voltage difference. A current SOC or the reference SOC is divided by the voltage difference to obtain a first slope or a second slope. The first slope is divided by the second slope to obtain an adjustment ratio. An electric charge capacity for charging the battery is counted by a coulomb counting method to obtain a count capacity of discharging that is multiplied by the adjustment ratio to obtain an adjustment value. The adjustment value is subtracted from a previously recorded remaining capacity to obtain a new remaining capacity. The new remaining capac- (Continued)

ity is divided by a full charge capacity to estimate a new SOC of battery.

6 Claims, 7 Drawing Sheets

(51) Int. Cl.
*G01R 31/382* (2019.01)
*G01R 19/165* (2006.01)
*G01R 31/36* (2020.01)

(56) References Cited

U.S. PATENT DOCUMENTS

| | | | |
|---|---|---|---|
| 10,371,755 B2* | 8/2019 | Meacham | H02J 7/0047 |
| 2009/0132186 A1* | 5/2009 | Esnard | G01R 31/3648 |
| | | | 702/63 |
| 2012/0310568 A1* | 12/2012 | Wang | G01R 31/3842 |
| | | | 702/63 |
| 2016/0089994 A1* | 3/2016 | Keller | H02J 7/0014 |
| | | | 320/153 |
| 2017/0274794 A1* | 9/2017 | Tenmyo | G01R 31/367 |
| 2018/0321324 A1* | 11/2018 | Karippumannil Prasad | |
| | | | G01R 31/367 |

OTHER PUBLICATIONS

K. Ng et al.("An enhanced coulomb counting method for estimating state-of-charge and state-of-health of lead-acid batteries," INTELEC 2009—31st International Telecommunications Energy Conference, 2009, pp. 1-5, doi: 10.1109/INTLEC.2009.5351796) (Year: 2009).*

Wen-Yeau Chang ("The State of Charge Estimating Methods for Battery: A Review", International Scholarly Research Notices, vol. 2013, Article ID 953792, 7 pages, 2013. https://doi.org/10.1155/2013/953792) (Year: 2013).*

Murnane et al. ("A Closer Look at State of Charge ( SOC ) and State of Health ( SOH ) Estimation Techniques for Batteries." (2017) (Year: 2017).*

* cited by examiner

ESTIMATION METHOD FOR STATE OF CHARGE OF BATTERY

This non-provisional application claims priority claim under 35 U.S.C. § 119 (a) on China Patent Application No. 201811489708.2 filed Dec. 6, 2018, the entire contents of which are incorporated herein by reference.

FIELD OF THE INVENTION

The present invention relates to an estimation method, particularly to a method for estimating a state of charge of battery.

BACKGROUND

With the evolution of battery technology, many electronic devices are usually configured with a battery therein. The energy required for the operation of the electronic device can be provided by quantity of electric charge stored in the battery. The quantity of electric charge stored in the battery will gradually decrease with the operation of the electronic device. In order to prevent that the quantity of electric charge of the electronic device is completely depleted and the operation of the electronic device is stopped without warning, many electronic devices are having a function that is able to estimate a state of charge (SOC) of the battery. The state of charge (SOC) of the battery can also be defined as the state of available energy in the battery, which is usually expressed as a percentage, for example, SOC=RM (remaining capacity)/FCC (full charge capacity). By the estimation of the state of charge (SOC) of the battery, the user of the electronic device can perform to charge on the battery in advance when the quantity of electric charge of the battery is insufficient.

The method of the look-up table, for example, OVC lookup table, is often adopted for estimating the state of charge (SOC) of the battery. The OVC lookup table lists each of the state of charges (SOCs) corresponding to each of voltages. A corresponding state of charge (SOC) can be found from the OVC look-up table based on the current voltage of the battery detected. Although the OVC look-up table method can estimate the state of charge (SOC) quickly and simply during the discharge process of the battery, the error of estimation of the state of charge (SOC) is often caused by the discharge of a large current or a harsh environment (such as an environment of higher temperature or lower temperature). Accordingly, when the battery is discharged to the cut-off voltage, the state of charge (SOC) may drastically drop to 0%, and therefore the discharge of the battery is stopped without warning, such that the electronic device with the battery as the power will suddenly stop to operate. If the battery is applied to the an electric vehicle, the electric vehicle may also suddenly stop to be driven due to the error of estimation of the state of charge (SOC) of the battery, which will be resulting in a problem of driving safety.

For the above reason, the present invention provides an innovative method for estimating a state of charge (SOC) of battery, which will be able to estimate the state of charge (SOC) of battery, accurately, so as to avoid that the electronic device with the battery as the power is suddenly stop to operate, which is the object to be achieved by the present invention.

SUMMARY

It is one objective of the present invention to provide an estimation method for state of charge of battery, which can accurately estimate a state of charge of battery, such that the state of charge (SOC) of the battery does not drastically drop in the discharge of the battery, thereby the safety and stability of the operation of the electronic device using the battery as power can be effectively increased.

To achieve the above object, the present invention provides an estimation method for state of charge of battery, the estimation method is applied to an electronic device having a battery, steps of the estimating method comprising: performing a process for adjusting a remaining capacity of the battery during a discharge when a current of the battery is less than zero; performing the process for adjusting the remaining capacity of the battery during the discharge, steps of which comprising: detecting a voltage of the battery; inquiring a reference state of charge from a lookup table based on the detected voltage of the battery; subtracting a voltage threshold from the detected voltage of the battery to obtain a voltage difference; obtaining a first slope based on a current state of charge divided by the voltage difference; obtaining a second slope based on the reference state of charge divided by the voltage difference; obtaining an adjustment ratio based on the first slope divided by the second slope; counting an electric charge capacity discharged by the battery by a coulomb counting method to obtain a count capacity of discharging; obtaining an adjustment value based on the count capacity of discharging multiplied by the adjustment ratio; subtracting the adjustment value from a previously recorded remaining capacity to estimate a new remaining capacity; and estimating a new state of charge based on the new remaining capacity divided by a full charge capacity.

In one embodiment of the present invention, further comprising a update process of the full charge capacity, steps of which comprising: determining whether the voltage of the battery is less than or equal to the voltage threshold; if the voltage of the battery is not less than or not equal to the voltage threshold, prohibiting to perform the update process of the full charge capacity; if the voltage of the battery is less than or equal to the voltage threshold, continuing to determine whether the current of the battery is less than zero; if the current of the battery is less than zero, prohibiting to perform the update process of the full charge capacity; if the current of the battery is not less than zero, starting to perform the update process of the full charge capacity; performing the update process of the full charge capacity, steps of which comprising: counting an electric charge capacity for charging the battery by the coulomb counting method to obtain a count capacity of charging and adding the count capacity of charging to the previously recorded remaining capacity to obtain a new recorded remaining capacity; and determining whether the battery is fully charged, if so, updating the full charge capacity by the new recorded remaining capacity, and if not, returning to the step of determining whether the current of the battery is less than zero.

In one embodiment of the present invention, further comprising the following steps: determining whether a current or an average current of the battery is zero, if so, performing a process for correcting the remaining capacity of the battery in a uncharged and undischarged state, and if not, indicating that the battery is being charged or discharged; performing the process for correcting the remaining capacity of the battery in the uncharged and undischarged state, steps of which comprising: detecting the voltage of the battery; inquiring a reference remaining capacity from the lookup table based on the detected voltage of the battery; and determining whether the previously recorded remaining capacity is greater than the reference remaining capacity, returning to the step of determining whether the current or the average current of the battery is zero when the previously recorded remaining capacity is less than the reference remaining capacity, performing a deduction process of a self-consumable capacity at least once for the previously recorded remaining capacity when the previously recorded remaining capacity is greater than the reference remaining capacity so as to obtain a new recorded remaining capacity that is less than the reference remaining capacity, or returning to the step of determining whether the current or the average current of the battery is zero when the deduction process of the self-consumable capacity has finished.

In one embodiment of the present invention, further comprising the following steps: performing a process for counting the remaining capacity of the battery during a charging of the battery when the current of the battery is greater than zero; performing the process for counting the remaining capacity of the battery during the charging of the battery, steps of which comprising: counting an electric charge capacity for charging the battery by the coulomb counting method to obtain a count capacity of charging and adding the count capacity of charging to the previously recorded remaining capacity to obtain a new recorded remaining capacity; and estimating the new state of charge based on the new remaining capacity divided by the full charge capacity.

In one embodiment of the present invention, wherein the voltage threshold is an end of discharge voltage, or a specific voltage corresponding to a low state of charge.

In one embodiment of the present invention, wherein the lookup table is a correspondence table of the voltage of the battery, the reference state of charge, and the reference remaining capacity.

DETAILED DESCRIPTION OF THE PREFERRED EMBODIMENTS

Figure 1:
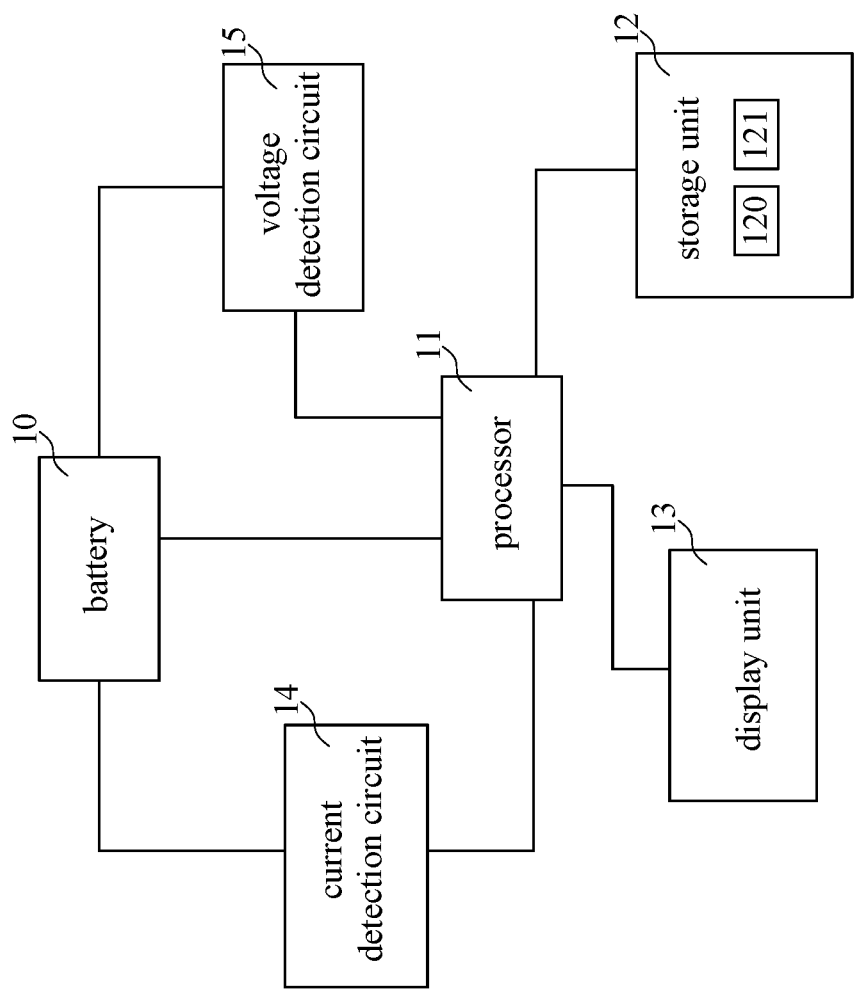
FIG. 1 is a circuit diagram of an electronic device according to one embodiment of the present invention.

Referring to FIGS. 1, 2, 3, 4, and 5, there are shown a circuit diagram of an electronic device according to one embodiment of the present invention, a flow chart of a method for estimating a state of charge (SOC) of battery according to one embodiment of the present invention, a flow chart of a process for adjusting a remaining capacity of battery during the discharge according to the present invention, a curve diagram of a state of charge (SOC) of battery of the present invention, and a flowchart of a process for correcting a remaining capacity of battery in the uncharged and undischarged state of the present invention, respectively. As shown in FIG. 1, the electronic device 100 of the present invention is an electric vehicle, a handheld electronic device or a device with a battery as a main power supply. The electronic device 100 comprises a battery 10, a processor 11, a storage unit 12, a display unit 13, a current detection circuit 14, and a voltage detection circuit 15. The processor 11 is connected to the battery 10, the storage unit 12, the display unit 13, the current detection circuit 14, and the voltage detection circuit 15. The storage unit 12 stores a battery capacity estimating program 120 and a lookup table 121, and records information related for a remaining capacity (RM) and a full charge capacity (FCC) of the battery 10. The electronic device 100 of the present invention may estimate a state of charge (SOC) of the battery 10 by the battery capacity estimating program 120. Besides, the estimated state of charge (SOC) will be stored in the storage unit 12 and presented on the display unit 13.

Figure 2:
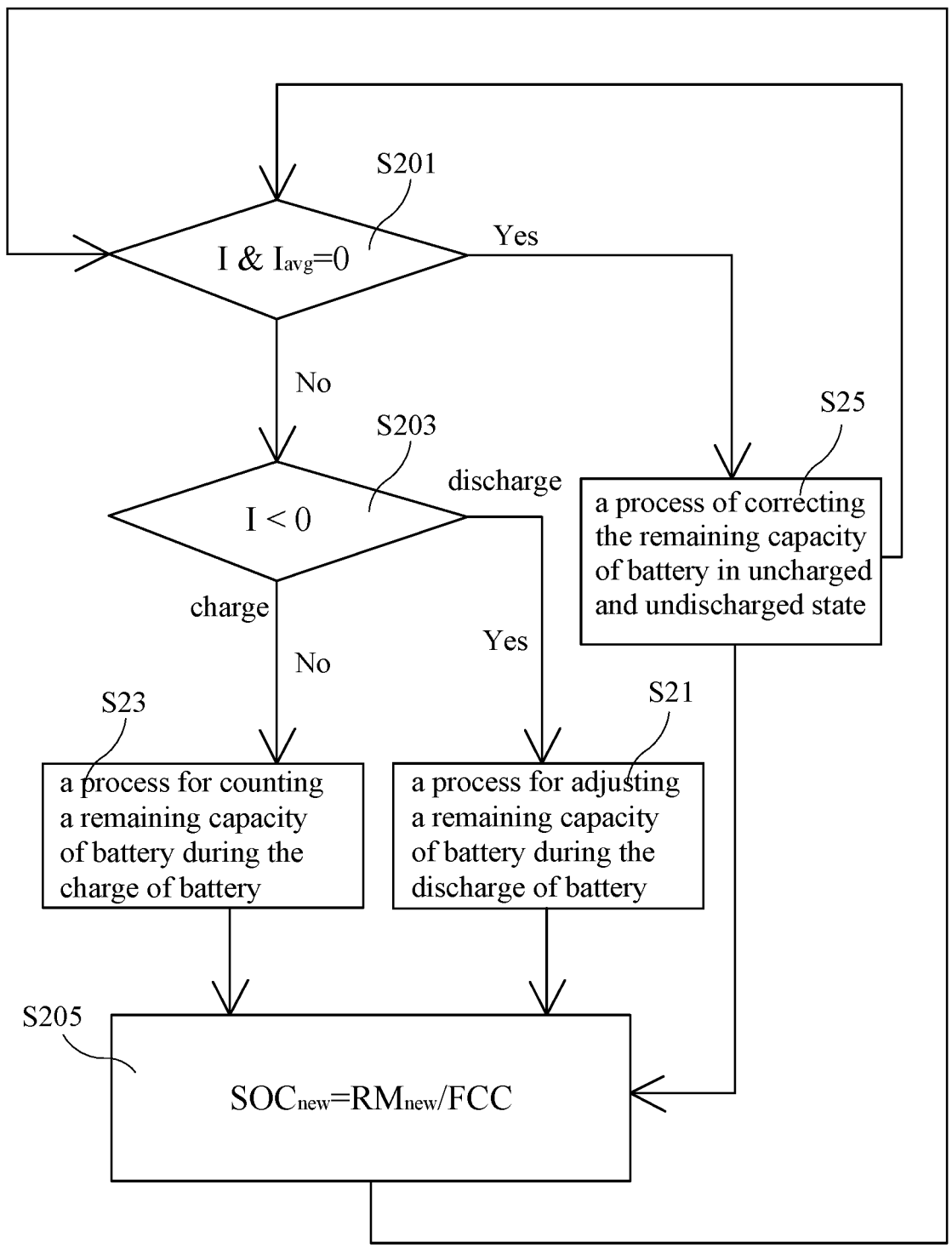
FIG. 2 is a flow chart of a method for estimating a state of charge (SOC) of battery according to one embodiment of the present invention.

As shown in FIG. 2, the flow chart of the method for estimating the state of charge (SOC) of battery of the present invention is described in the following. In step S201, firstly, the processor 11 starts the battery capacity estimating program 120, which will detect a current (I) of the battery 10 by the current detection circuit 14, and determine whether the current (I) or the average current ($I_{avg}$) of the battery 10 is zero. If the current (I) or the average current ($I_{avg}$) of the battery 10 is not zero, it indicates that the battery 10 is charging or discharging, the battery capacity estimating program 120 will perform a step S203 for determining whether the current (I) of the battery 10 is less than zero. If the current (I) of the battery 10 is less than zero, it indicates that the battery 10 is discharging, the battery capacity estimating program 120 will perform a process S21 for adjusting a remaining capacity of the battery 10 during the discharge of the battery 10. On the contrary, if the current (I) of the battery 10 is not less than zero, it indicates that the battery 10 is charging, the battery capacity estimating program 120 will perform a process S23 for counting a remaining capacity of the battery 10 during the charge of the battery 10. Furthermore, returning to the step S201, if the current (I) or the average current ($I_{avg}$) of the battery 10 is zero, it indicates that the battery 10 is in an uncharged and undischarged state, the battery capacity estimating program 120 will perform a process S25 for correcting the remaining capacity of the battery 10 in the uncharged and undischarged state.

Figure 3:
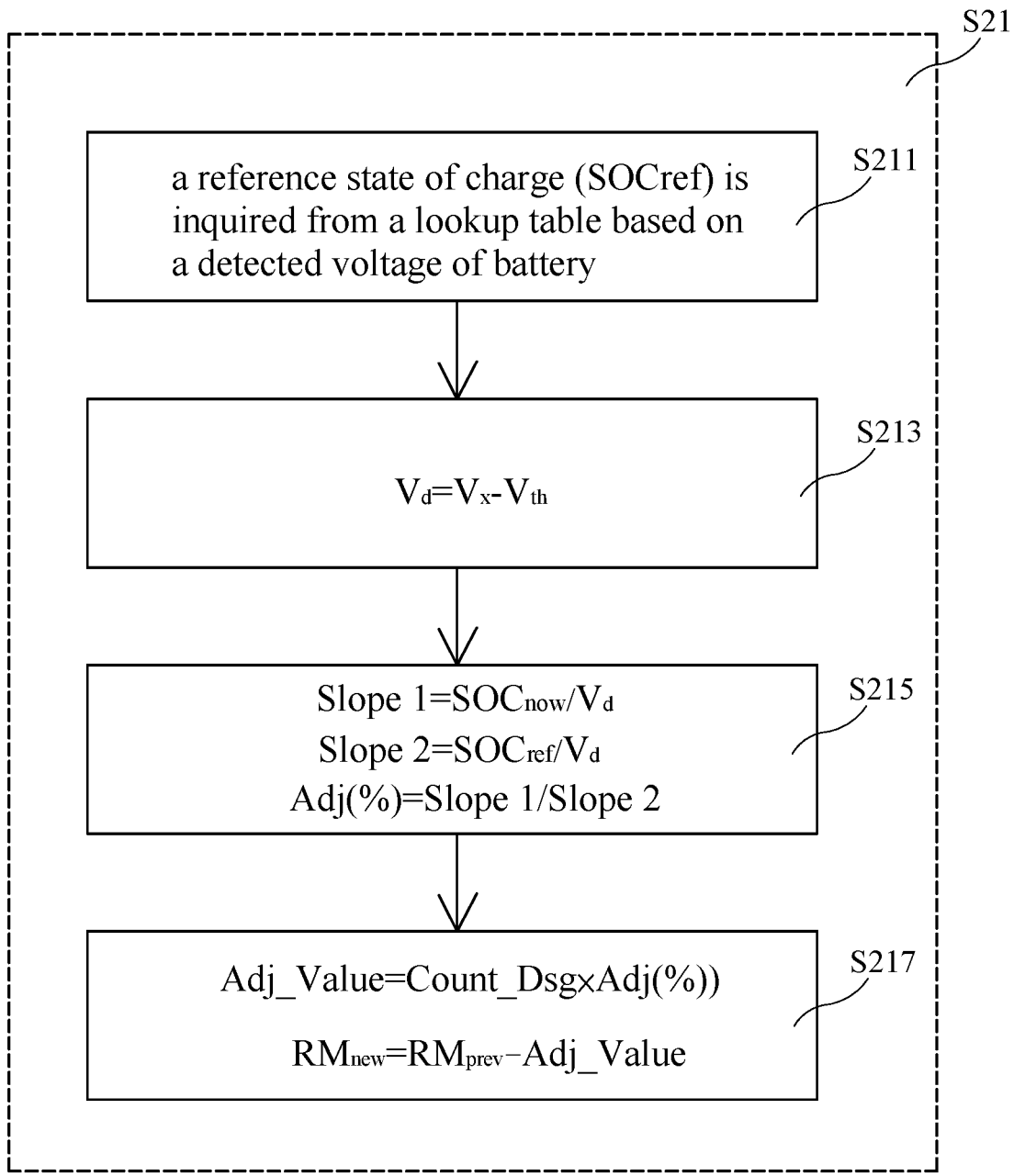
FIG. 3 is a flow chart of a process for adjusting a remaining capacity of battery during the discharge according to the present invention.
Figure 4:
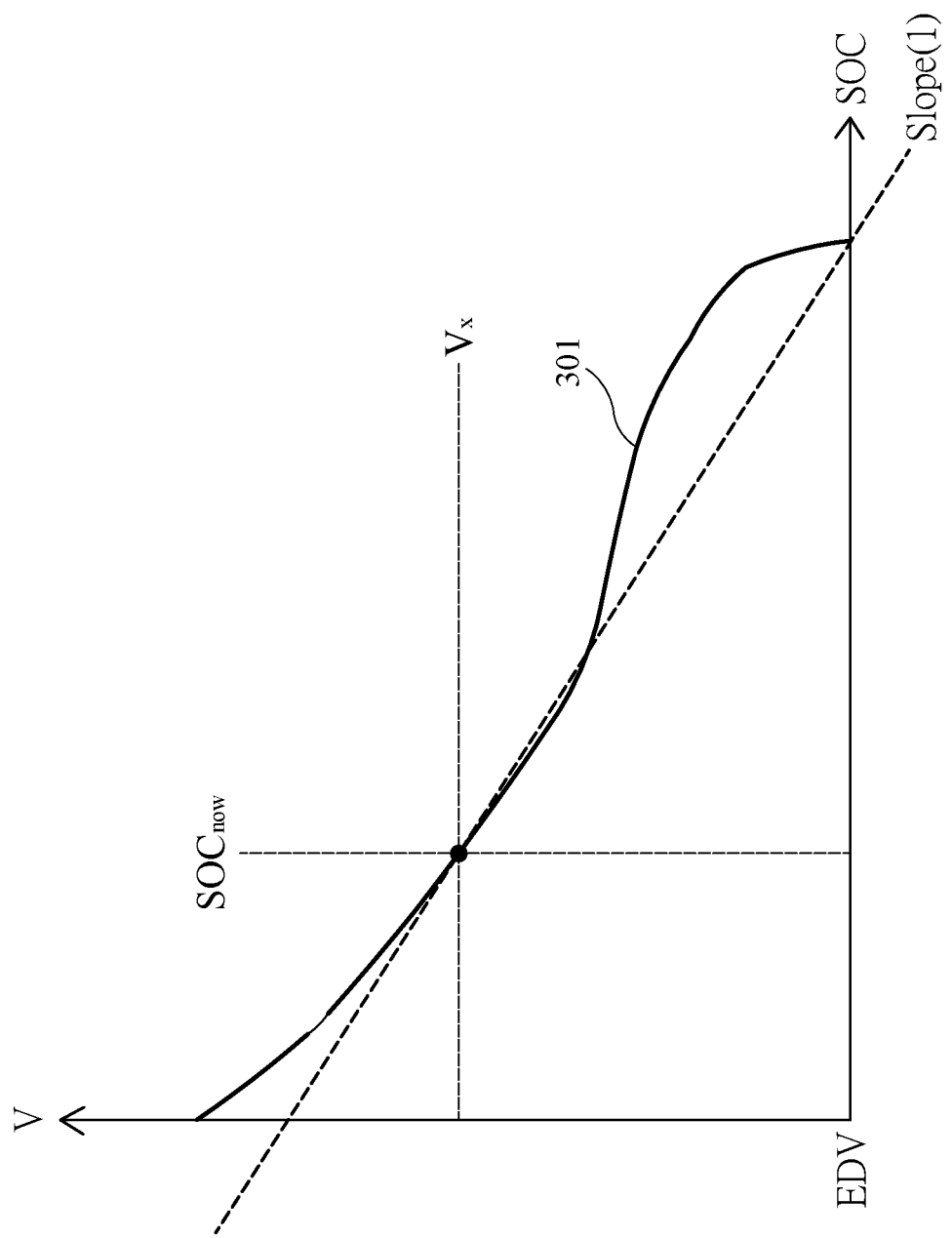
FIG. 4 is a curve diagram of a state of charge (SOC) of battery of the present invention.

As shown in FIG. 3, when the battery 10 is discharging, the battery capacity estimating program 120 will perform the process S21 for adjusting the remaining capacity of the battery 10 during the discharge. In step S211 of the process S21, firstly, the processor 11 detects a voltage ($V_x$) of the battery 10 by the voltage detection circuit 15, and inquiries a corresponding reference state of charge ($SOC_{ref}$) from the lookup table 121 based on the detected voltage ($V_x$). In one embodiment of the present invention, the lookup table 121 is a correspondence table of a voltage (V) of the battery 10, a reference state of charge ($SOC_{ref}$), and a reference remaining capacity ($RM_{ref}$), and lists the reference state of charge ($SOC_{ref}$) and the reference remaining capacity ($RM_{ref}$) corresponding to each of the voltages (V). For example, the voltage A1 (mV) is corresponding to the reference state of charge ($SOC_{ref}$) of B1 (%) and the reference remaining capacity ($RM_{ref}$) of C1 (mA), the voltage A2 (mV) is corresponding to the reference state of charge ($SOC_{ref}$) of B2 (%) and the reference remaining capacity ($RM_{ref}$) of C2 (mA), and the voltage $A_N$(mV) is corresponding to the reference state of charge ($SOC_{ref}$) of $B_N$(%) and the reference remaining capacity ($RM_{ref}$) of $C_N$(mA), etc. In step S213, a voltage threshold ($V_{th}$) is subtracted from the detected voltage ($V_X$) to obtain a voltage difference ($V_d = V_X - V_{th}$). In one embodiment of the present invention, the voltage threshold ($V_{th}$) can be a specific voltage corresponding to a low state of charge (SOC), for example, the voltage threshold ($V_{th}$) is corresponding to 0% SOC or 5% SOC. In another embodiment of the present invention, otherwise, the voltage threshold ($V_{th}$) is an end of discharge voltage (EDV). In step S215, the current state of charge ($SOC_{now}$) is divided by the voltage difference ($V_d$) to obtain a first slope (Slope 1) of a discharge curve 301 of the battery 10, as shown in FIG. 4; the reference state of charge ($SOC_{now}$) is divided by the voltage difference ($V_d$) to obtain a second slope (Slope 2); then, the first slope (Slope 1) is divided by the second slope (Slope 2) to obtain an adjustment ratio (Adj (%)). In step S217, the processor 11 counts an electric charge capacity discharged by the battery 10 by a coulomb counting method to obtain a count capacity of discharging (Count_Dsg), and multiplies the count capacity of discharging (Count_Dsg) by the adjustment ratio (Adj (%)) to obtain an adjustment value (Adj_Value=Count_Dsg×Adj (%)); then, the adjustment value (Adj_Value) is subtracted from a previously recorded remaining capacity ($RM_{ref}$) to obtain a new remaining capacity ($RM_{new} = RM_{prev} - $ Adj_Value). Referring to FIG. 2, again, a step S205 is performed after performing the process S21, the new remaining capacity ($RM_{new}$) is divided by a full charge capacity (FCC) to obtain a new state of charge ($SOC_{new} = RM_{new}/FCC$).

As the above description, during the discharge process of the battery, the errors of estimation of the state of charge (SOC) often occur due to the discharge of a large current or a harsh environment. Accordingly, when the first slope (Slope 1) is larger than the second slope (Slope 2), it represents that the current state of charge ($SOC_{now}$) is higher than the actual state of charge, a large adjustment value (Adj_Value) will be subtracted from the previously recorded remaining capacity ($RM_{prev}$); on the contrary, when the first slope (Slope 1) is smaller than the second slope (Slope 2), it represents that the current state of charge ($SOC_{now}$) is lower than the actual state of charge, a smaller adjustment value (Adj_Value) will be subtracted from the previously recorded remaining capacity ($RM_{prev}$). The remaining capacity (RM) can be immediately adjusted in the discharge of the battery 10 so that the estimation of the state of charge (SOC) can be more accurate.

Returning to step S203, when the processor 11 determines that the current (I) of the battery 10 is greater than zero, the battery capacity estimation program 120 will perform the process S23 for counting the remaining capacity of the battery 10 during the charge of the battery 10. In the process S23, the processor 11 counts the electric charge capacity for charging the battery 10 by the coulomb counting method to obtain a count capacity of charging (Count_Chg), and adds the count capacity of charging (Count_Chg) to the previously recorded remaining capacity ($RM_{prev}$) to obtain a new remaining capacity ($RM_{new} = RM_{prev} + $ Count_Chg). The step S205 is performed after the process S23 is complete so that the new remaining capacity ($RM_{new}$) is divided by the full charge capacity (FCC) to obtain a new state of charge ($SOC_{new} = RM_{new}/FCC$).

Figure 5:
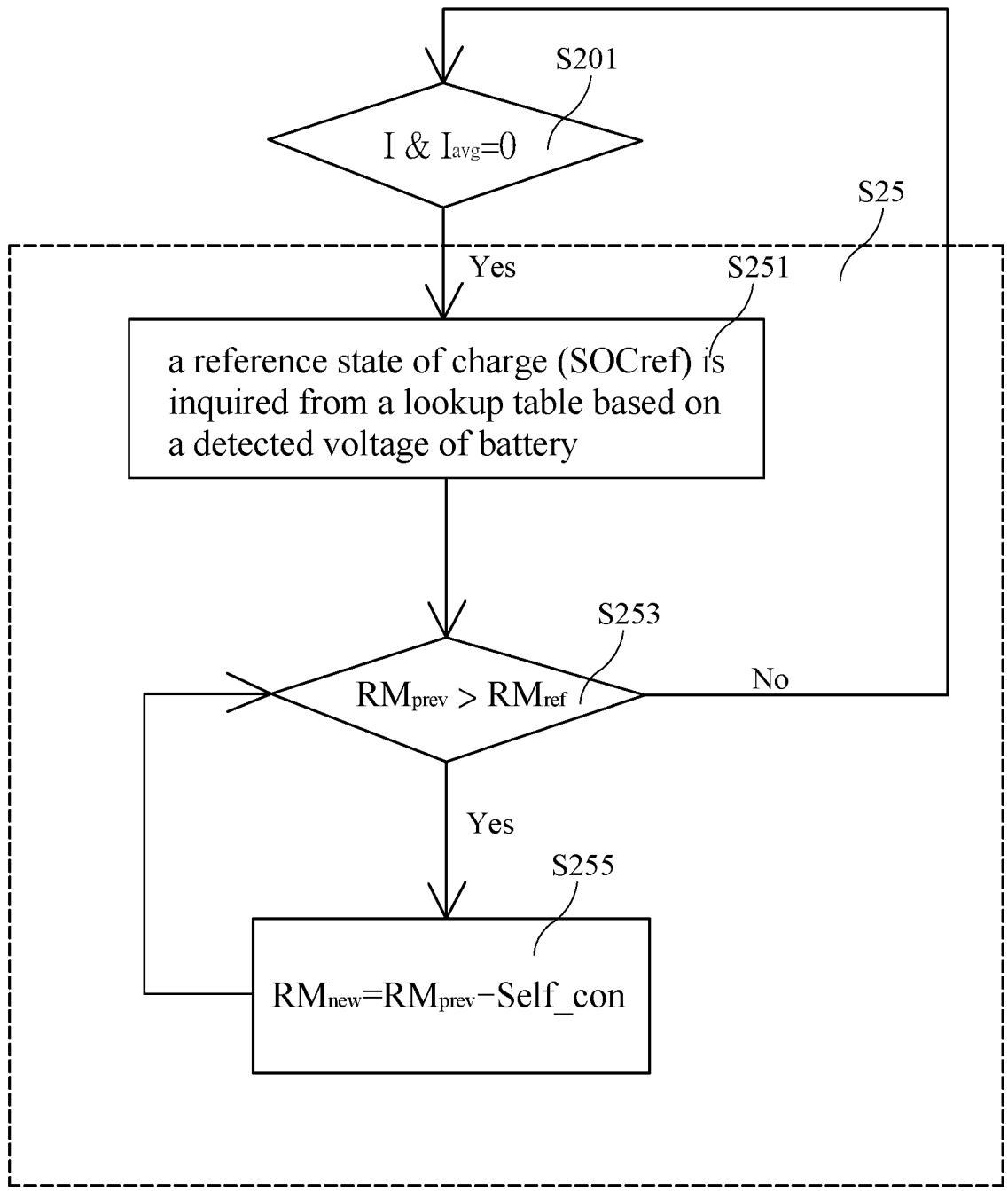
FIG. 5 is a flowchart of a process for correcting a remaining capacity of battery in the uncharged and undischarged state of the present invention.

Returning to step S201, when the current (I) or the average current ($I_{avg}$) of the battery 10 is zero, it indicates that the battery 10 is in an uncharged and undischarged state, the battery capacity estimating program 120 will perform the process S25 for correcting the remaining capacity of the battery 10 in the uncharged and undischarged state. As shown in FIG. 5, in step S251 of the process S25, firstly, the processor 11 detects the voltage ($V_x$) of the battery 10 by the voltage detection circuit 15, and inquiries the corresponding reference state of charge ($SOC_{ref}$) from the lookup table 121 based on the detected voltage ($V_x$). In step S253, the processor 11 determines whether the previously recorded remaining capacity ($RM_{prev}$) is greater than the reference remaining capacity ($RM_{ref}$). If the previously recorded remaining capacity ($RM_{prev}$) is less than the reference remaining capacity ($RM_{ref}$), the previously recorded remaining capacity ($RM_{prev}$) will be not updated, and returning to S201, again, the processor 11 continues to determine whether the current (I) or the average current ($I_{avg}$) of the battery 10 is Zero. On the contrary, if the previously recorded remaining capacity ($RM_{prev}$) is greater than the reference remaining capacity ($RM_{ref}$), performing step S255, a deduction process of a self-consumption capacity (Self_con) is performed at least once for the previously recorded remaining capacity ($RM_{prev}$) so as to obtain a new remaining capacity ($RM_{new} = RM_{prev} - $Self_con) of the battery 10. Those steps S253 and S255 are performed, continually, until the new remaining capacity ($RM_{new}$) is less than the reference capacity ($RM_{ref}$). In the present invention, the self-consumption capacity (Self_con) is a value for correcting a remaining capacity of the battery 10, and is set as a small unit of value, such as 1 mAh or other value. When the deduction process of the self-consumption capacity (Self_con) has completed and the new remaining capacity ($RM_{new}$) has less than the reference capacity ($RM_{ref}$), the new remaining capacity ($RM_{new}$) will be stored in the storage unit 12; afterwards, returning to the step 201, the processor 11 determines whether the current (I) or the average current ($I_{avg}$) of the battery 10 is zero. Accordingly, the remaining capacity recorded, for example, $RM_{new}$, is able to be corrected one or more times by the self-consumption capacity (Self_con) and therefore gradually approached to the corresponding reference capacity ($RM_{ref}$) in the lookup table 121. After the process S25 for correcting the remaining capacity of the battery 10 in the uncharged and undischarged state is complete, continuing to perform the step S205, the new remaining capacity ($RM_{new}$) is divided by the full charge capacity (FCC) to obtain the new state of charge ($SOC_{new} = RM_{new}/FCC$).

Figure 6:
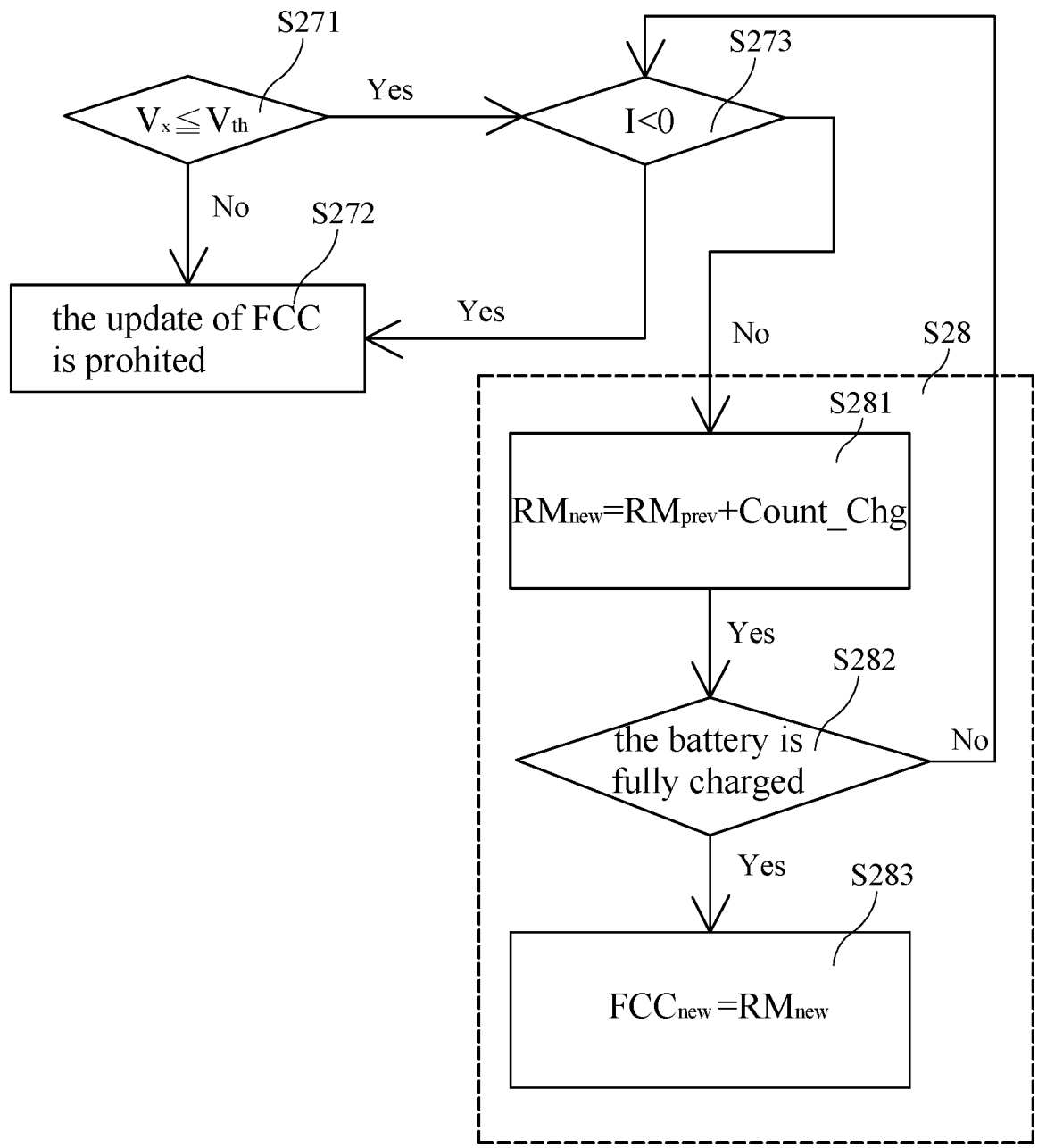
FIG. 6 is a flowchart of a process of updating a full charge capacity (FCC) of battery of the present invention.

In one embodiment of the present invention, further, an update process of a full charge capacity (FCC) is provided, as shown in FIG. 6. In the update process of a full charge capacity (FCC), firstly, performing the step S271, the processor 11 determines whether the voltage ($V_X$) of the battery 10 is less than or equal to the voltage threshold ($V_{th}$). The voltage threshold ($V_{th}$) can be the end of discharge voltage (EDV). If the voltage ($V_X$) is not less than, or not equal to the voltage threshold ($V_{th}$), a step S272 will be performed, a FCC update flag is set to zero to prohibit the update of the full charge capacity (FCC). On the contrary, if the voltage ($V_X$) is less than or equal to the voltage threshold ($V_{th}$), continuing to perform a step S272, it is determined whether the current (I) of the battery 10 is less than zero. If the current (I) of the battery 10 is less than zero, returning to the step S272, the update of the full charge capacity (FCC) will be prohibited. On the contrary, if the current (I) of the battery 10 is not less than zero, the FCC update flag will be set to one to perform an update process S28 of the full charge capacity (FCC). In the update process S28 of the full charge capacity (FCC), firstly, performing a step S281, the processor 11 counts the electric charge capacity for charging the battery 10 by the coulomb counting method to obtain a count capacity of charging (Count_Chg), and adds the count capacity of charging (Count_Chg) to the previously recorded remaining capacity ($RM_{prev}$) to obtain the new remaining capacity ($RM_{new}$=$RM_{prev}$+Count_Chg). Then, continuing to perform the step S282, the processor 11 determines whether the battery 10 is fully charged. If the battery 10 has fully charged, performing the step S283, a new full charge capacity ($FCC_{new}$) will be updated by the new remaining capacity ($RM_{new}$) recorded. On the contrary, if the battery 10 is not fully charged, returning to the step S273, the processor 10 determines whether the current (I) of the battery 10 is less than zero to decide whether to continue the process S28 for updating of the full charge capacity (FCC). Accordingly, the estimation of the state of charge (SOC) can be more accurate by the update of the full charge capacity (FCC).

Figure 7:
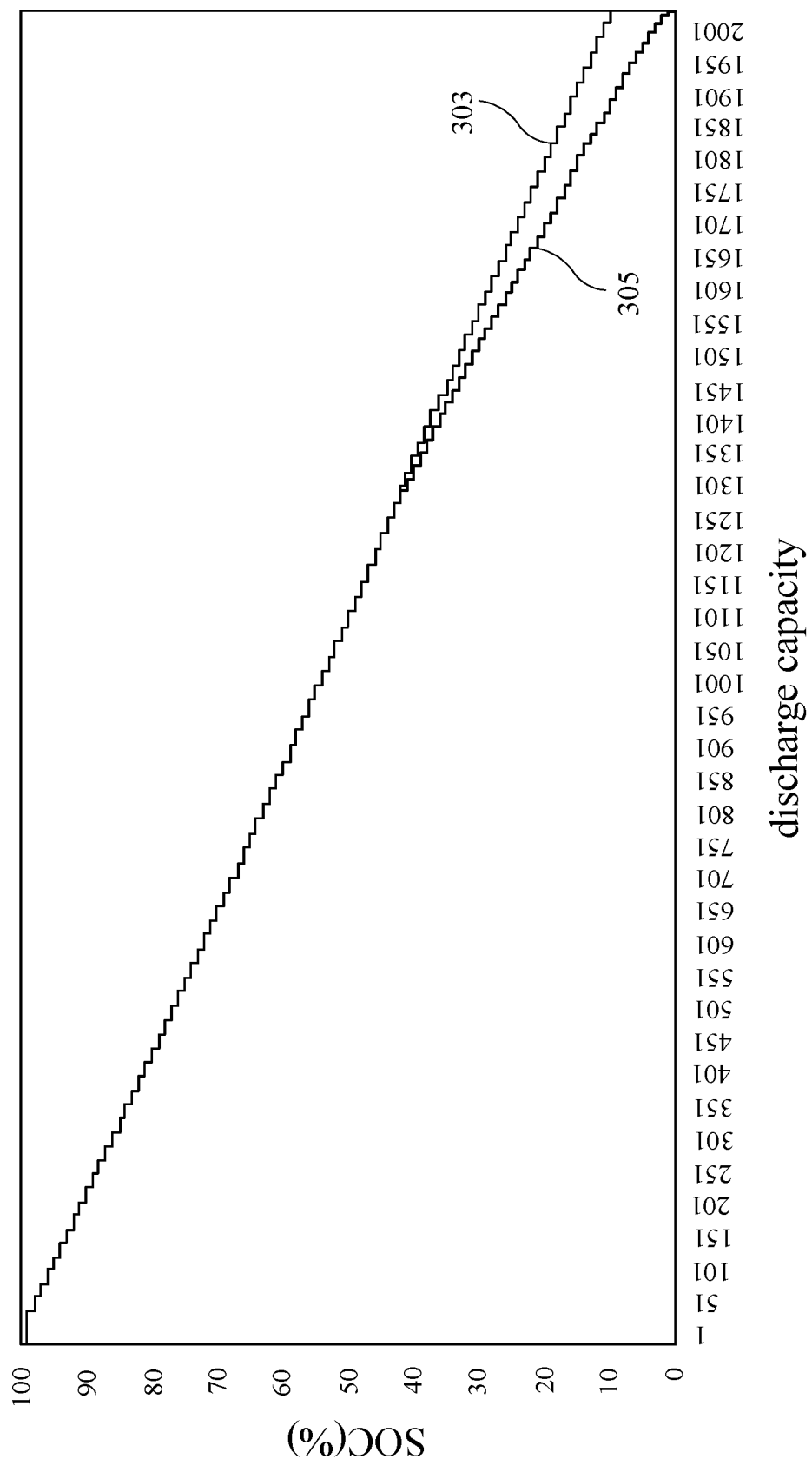
FIG. 7 is a curve of estimation of state of charge (SOC) in the discharge of the battery according to the present invention, and a curve of estimation of state of charge in the discharge of the battery according to the prior art.

Referring to FIG. 7, there is shown a curve of estimation of state of charge (SOC) in the discharge of the battery according to the present invention, and a curve of estimation of state of charge in the discharge of the battery according to the prior art. As shown in FIG. 7, the prior art only uses the voltage look-up table method to estimate the state of charge (SOC) in the discharge of the battery, the estimation result of which is as shown by a curve 303 that is a linear curve. The state of charge (SOC) in the discharge of the battery is estimated only by the voltage look-up table method, which is easy to cause an error of estimation of the state of charge (SOC) because of the discharge of the large current or the harsh environment. When the electric charge of the battery is overestimated and the state of charge (SOC) of the battery is at a lower level, the state of charge (SOC) may drastically drop to 0% if the discharge of the battery is continued. For example, in the curve 303, when the electric charge of the battery is overestimated and the state of charge (SOC) of the battery is 10%, if the discharge of the battery is continued, the state of charge (SOC) may drastically drop from 10% to 0% such that the electronic device with the battery as the power will be stopped to operate without warning.

The present invention estimates the state of charge (SOC) in the discharge of the battery by the battery capacity estimation program 120, the estimation result of which is as shown by a curve 304. This curve 305 is a parabolic line. Taking FIG. 7 as an example, the remaining capacity (RM) and the state of charge (SOC) in the discharge of the battery 10 can be adjusted by the battery capacity estimation program 120. When the state of charge (SOC) of the battery 10 is discharged to less than 40%, the state of charge (SOC) on the curve 305 is significantly adjusted compared to the state of charge (SOC) on linear curve 303. Because the state of charge (SOC) of the battery 10 is immediately adjusted by the battery capacity estimation program 120, even if the battery continues to be discharged when the battery 10 is in a lower state of charge (SOC), the state of charge (SOC) of the battery 10 does not drastically drop to 0%, for example, the state of charge (SOC) does not drastically drop from 10% to 0% in the discharge of the battery 10, in such a way that the safety and stability of the operation of the electronic device using the battery 10 as power can be effectively increased.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

The invention claimed is:

1. An estimation method for state of charge of battery, wherein the estimation method is applied to an electronic device having a battery, steps of the estimating method comprising:
    performing a process for adjusting a remaining capacity of the battery during a discharge when a current of the battery is less than zero;
    performing the process for adjusting the remaining capacity of the battery during the discharge, steps of which comprising:
        detecting a voltage of the battery;
        inquiring a reference state of charge from a lookup table based on the detected voltage of the battery;
        subtracting a voltage threshold from the detected voltage of the battery to obtain a voltage difference;
        obtaining a first slope based on a current state of charge divided by the voltage difference;
        obtaining a second slope based on the reference state of charge divided by the voltage difference;
        obtaining an adjustment ratio based on the first slope divided by the second slope;
        counting an electric charge capacity discharged by the battery by a coulomb counting method to obtain a count capacity of discharging;
        obtaining an adjustment value based on the count capacity of discharging multiplied by the adjustment ratio;
        subtracting the adjustment value from a previously recorded remaining capacity to estimate a new remaining capacity; and
        estimating a new state of charge based on the new remaining capacity divided by a full charge capacity.

2. The estimating method according to claim 1, further comprising an update process of the full charge capacity, steps of which comprising:
    determining whether the voltage of the battery is less than or equal to the voltage threshold; if the voltage of the battery is not less than or not equal to the voltage threshold, prohibiting to perform the update process of the full charge capacity; if the voltage of the battery is less than or equal to the voltage threshold, continuing to determine whether the current of the battery is less than zero; if the current of the battery is less than zero, prohibiting to perform the update process of the full charge capacity; if the current of the battery is not less than zero, starting to perform the update process of the full charge capacity;
    performing the update process of the full charge capacity, steps of which comprising:
        counting an electric charge capacity for charging the battery by the coulomb counting method to obtain a count capacity of charging and adding the count capacity of charging to the previously recorded remaining capacity to obtain a new recorded remaining capacity; and
        determining whether the battery is fully charged, if so, updating the full charge capacity by the new recorded remaining capacity, and if not, returning to the step of determining whether the current of the battery is less than zero.

3. The estimating method according to claim 1, further comprising the following steps:

determining whether a current or an average current of the battery is zero, if so, performing a process for correcting the remaining capacity of the battery in a uncharged and undischarged state, and if not, indicating that the battery is being charged or discharged;

performing the process for correcting the remaining capacity of the battery in the uncharged and undischarged state, steps of which comprising:

detecting the voltage of the battery;

inquiring a reference remaining capacity from the lookup table based on the detected voltage of the battery; and determining whether the previously recorded remaining capacity is greater than the reference remaining capacity, returning to the step of determining whether the current or the average current of the battery is zero when the previously recorded remaining capacity is less than the reference remaining capacity, performing a deduction process of a self-consumable capacity at least once for the previously recorded remaining capacity when the previously recorded remaining capacity is greater than the reference remaining capacity so as to obtain a new recorded remaining capacity that is less than the reference remaining capacity, or returning to the step of determining whether the current or the average current of the battery is zero when the deduction process of the self-consumable capacity has finished.

4. The estimating method according to claim 1, further comprising the following steps:

performing a process for counting the remaining capacity of the battery during a charging of the battery when the current of the battery is greater than zero;

performing the process for counting the remaining capacity of the battery during the charging of the battery, steps of which comprising:

counting an electric charge capacity for charging the battery by the coulomb counting method to obtain a count capacity of charging and adding the count capacity of charging to the previously recorded remaining capacity to obtain a new recorded remaining capacity; and estimating the new state of charge based on the new remaining capacity divided by the full charge capacity.

5. The estimating method according to claim 1, wherein the voltage threshold is an end of discharge voltage, or a specific voltage corresponding to a low state of charge.

6. The estimating method according to claim 3, wherein the lookup table is a correspondence table of the voltage of the battery, the reference state of charge, and the reference remaining capacity.

* * * * *